United States Patent
Lo et al.

(10) Patent No.: US 10,686,383 B2
(45) Date of Patent: Jun. 16, 2020

(54) POWER CONTROL CIRCUIT, PULSE SIGNAL DETECTION CIRCUIT, AND PULSE SIGNAL DETECTION METHOD (71) Applicant: RICHTEK TECHNOLOGY CORPORATION, Zhubei, Hsinchu (TW)

(72) Inventors: Li-Di Lo, Zhubei (TW); Chien-Fu Tang, Hsinchu (TW); Isaac Y. Chen, Hsinchu (TW)

(73) Assignee: RICHTEK TECHNOLOGY CORPORATION, Zhubei, Hsinchu (TW)

( * ) Notice: Subject to any disclaimer, the term of this patent is extended or adjusted under 35 U.S.C. 154(b) by 0 days.

(21) Appl. No.: 16/541,293

(22) Filed: Aug. 15, 2019

(65) Prior Publication Data
US 2020/0099307 A1 Mar. 26, 2020

(30) Foreign Application Priority Data
Sep. 21, 2018 (CN) .......................... 2018 1 1117639

(51) Int. Cl.
H02M 3/335 (2006.01)
H03K 5/19 (2006.01)

(52) U.S. Cl.
CPC ... *H02M 3/33507* (2013.01); *H02M 3/33592* (2013.01); *H03K 5/19* (2013.01); *H02M 3/33523* (2013.01)

(58) Field of Classification Search
CPC ......... H02M 3/33507; H02M 3/33592; H02M 3/33523; H03K 5/19
See application file for complete search history.

(56) References Cited

U.S. PATENT DOCUMENTS 8,218,339 B2 * 7/2012 Li ..................... H02M 3/33592
363/21.06
10,079,547 B2 * 9/2018 Kikuchi .................. H02M 1/08

* cited by examiner

*Primary Examiner* — Kyle J Moody
(74) *Attorney, Agent, or Firm* — Tung & Associates (57) ABSTRACT

Whether a synchronous signal includes a synchronous pulse is determined by detecting whether there is a positive pulse higher than a positive threshold followed by a negative pulse lower than a negative threshold. The pulse signal detection method includes: comparing the synchronous signal with the positive threshold; comparing the synchronous signal with the negative threshold; and determining that the synchronous pulse exists when the positive pulse of the synchronous signal is higher than the positive threshold and the negative pulse of the synchronous signal is lower than the negative threshold in a post detection period after the positive pulse of the synchronous signal is determined higher than the positive threshold.

21 Claims, 8 Drawing Sheets

POWER CONTROL CIRCUIT, PULSE SIGNAL DETECTION CIRCUIT, AND PULSE SIGNAL DETECTION METHOD

CROSS REFERENCE

The present invention claims priority to CN 201811117639.2, filed on Sep. 21, 2018.

BACKGROUND OF THE INVENTION

Field of Invention

The present invention relates to a power control circuit, a pulse signal detection circuit, and a pulse signal detection method; particularly, it relates to such power control circuit, pulse signal detection circuit, and pulse signal detection method which are used in a flyback power converter.

Description of Related Art

Figure 1:
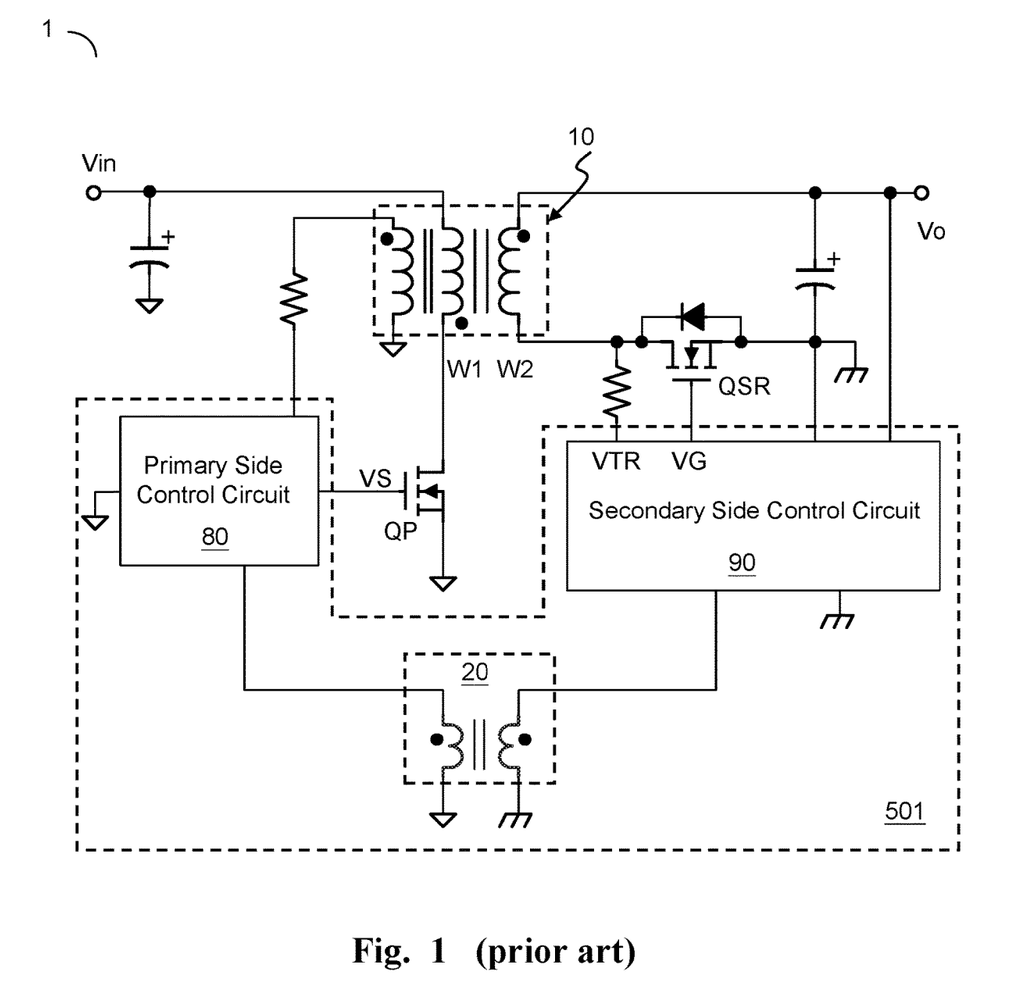
FIG. 1 shows a schematic diagram of a prior art flyback power converter 1.

FIG. 1 shows a prior art flyback power converter 1, which includes a power transformer 10, a power control circuit 501, a power transistor QP, and a synchronous rectifier (SR) transistor QSR. The power control circuit 501 is for controlling the flyback power converter 1. The power control circuit 501 includes a primary side control circuit 80, a secondary side control circuit 90, and a pulse transformer 20. The primary side control circuit 80 is for generating a switching signal VS to control the power transistor QP, so as to switch the power transformer 10, whereby an input voltage Vin is converted to an output voltage Vo. The secondary side control circuit 90 is for generating a synchronous rectifier (SR) control signal VG, to control (to turn ON/OFF) the SR transistor QSR.

The pulse transformer 20 transmits a synchronous signal between the primary side control circuit 80 and the secondary side control circuit 90 by an isolated transmission method (i.e., the primary side and the secondary side are not in direct electrical contact), to synchronize the switching signal VS and the SR control signal VG. The pulse transformer 20 is for delivering the synchronous signal from the primary side circuit 80 to the secondary side control circuit 90, or delivering the synchronous signal from the secondary side control circuit 90 to the primary side circuit 80. The primary side control circuit 80 generates the switching signal VS according to a synchronous pulse in the synchronous signal, or the secondary side control circuit 90 generates the SR control signal VG according to the synchronous pulse in the synchronous signal, to prevent the power transistor QP and the SR transistor QSR being conductive at the same time, which will cause circuitry damage. That is, the synchronous signal indicates a switching status of the switching signal VS or the SR control signal VG.

Figure 2A:
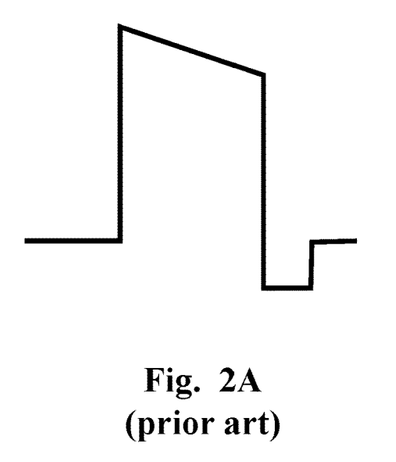
FIGS. 2A and 2B show two examples of the synchronous pulse in the prior art.

For accurate synchronization, it is crucial to detect the occurrence time point of the synchronous pulse precisely; therefore, the circuit design of a pulse signal detection circuit in the power control circuit 501 is very important. FIG. 2A shows one example of the synchronous pulse in the prior art, which has a relatively longer period of a positive pulse in the synchronous signal, and thus the synchronous pulse is relatively easier to be detected, and is relatively easier to be differentiated from noises, and the circuitry design of the pulse signal detection circuit is relatively easier. However, the delivery of such synchronous pulse requires a relatively higher inductance of the pulse transformer 20, whereby the size and manufacturing cost of the pulse transformer 20 is larger.

Figure 2B:
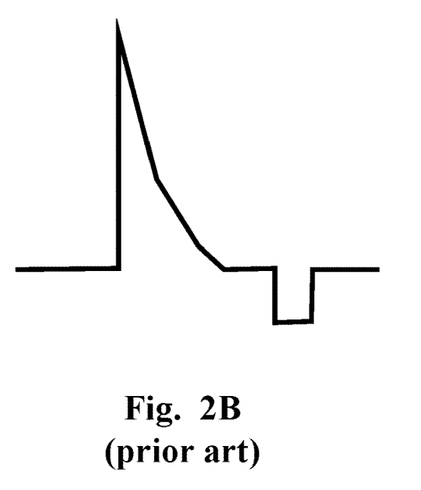

For reducing the size and the manufacturing cost of the power control circuit 501, the size of the pulse transformer 20 needs to be reduced, preferably within a single integrated circuit (IC) chip, or even more preferably, to be integrated with the primary side control circuit 80 or with the secondary side control circuit 90 as one IC chip. However, such pulse transformer 20 with a reduced size has a relatively lower inductance, and the synchronous pulse generated thereby is as shown in FIG. 2B, which has a relatively shorter period of the positive pulse, and thus the synchronous pulse is relatively harder to be detected, and is relatively harder to be differentiated from noises, and the circuitry design of the pulse signal detection circuit is relatively harder.

In view of above, the present invention provides a power control circuit, a pulse signal detection circuit, and a pulse signal detection method, which can precisely detect the occurrence time point of the synchronous pulse, but does not require a pulse transformer having a high inductance. As thus, the present invention can use a relatively smaller size pulse transformer 20, which can be integrated in the IC chip of the primary side control circuit 80 or the secondary side control circuit 90, for reducing the size and the manufacturing cost of the overall circuitry.

SUMMARY OF THE INVENTION

From one perspective, the present invention provides a power control circuit, configured to operably control a flyback power converter, the power control circuit including: a primary side control circuit, configured to operably generate a switching signal to control a power transistor of the flyback power converter, so as to control a primary winding of a power transformer of the flyback power converter to convert an input voltage to an output voltage; a secondary side control circuit, configured to operably generate a synchronous rectifier (SR) control signal to control a synchronous rectifier (SR) transistor of the flyback power converter, so as to control a secondary winding of the power transformer; a pulse transformer, which is coupled between the primary side control circuit and the secondary side control circuit, and is configured to operably generate a synchronous signal according to the switching signal or the SR control signal; and a pulse signal detection circuit, which is coupled to the pulse transformer, and is configured to operably receive the synchronous signal and detect a synchronous pulse in the synchronous signal to generate a status switching signal, wherein the synchronous pulse indicates a switching status of the switching signal or the SR control signal; wherein the pulse signal detection circuit determines that the synchronous pulse exists by detecting a positive pulse higher than a positive threshold and a negative pulse lower than a negative threshold in the synchronous signal during a detection period, and generates the status switching signal accordingly.

In one preferable embodiment, the pulse signal detection circuit includes: a first comparison circuit, which is coupled to the pulse transformer, and is configured to operably generate a first comparison signal according to the synchronous signal and the positive threshold; a second comparison circuit, which is coupled to the pulse transformer, and is configured to operably generate a second comparison signal according to the synchronous signal and the negative threshold; and a determination circuit, which is coupled to the first comparison circuit and the second comparison circuit, and is configured to operably determine that the synchronous pulse exists when the first comparison signal indicates that the positive pulse of the synchronous signal is higher than the positive threshold and the second comparison signal indicates that the negative pulse of the synchronous signal is lower than the negative threshold in a post detection period after the positive pulse of the synchronous signal is determined higher than the positive threshold, and generate the status switching signal accordingly; wherein the post detection period is related to the detection period.

In one preferable embodiment, the pulse signal detection circuit further includes a first timer circuit, which is coupled to the first comparison circuit, and is configured to operably count a first duration period during which the first comparison signal keeps indicating that the positive pulse of the synchronous signal is continuously higher than the positive threshold, and generate a first confirmation signal which is inputted to the determination circuit when the first duration period is longer than a first period threshold, whereby the determination circuit determines that the positive pulse is higher than the positive threshold according to the first confirmation signal; wherein the detection period starts from a start time point at which the first comparison signal indicates that the positive pulse of the synchronous signal is higher than the positive threshold, and ends at an end time point of an end of the post detection period.

In one preferable embodiment, the pulse signal detection circuit further includes a second timer circuit, which is coupled to the second comparison circuit, and is configured to operably count a second duration period during which the second comparison signal keeps indicating that the negative pulse of the synchronous signal is continuously lower than the negative threshold, and generate a second confirmation signal which is inputted to the determination circuit when the second duration period is longer than a second period threshold, whereby the determination circuit determines that the negative pulse is lower than the negative threshold according to the second confirmation signal.

In one preferable embodiment, the determination circuit includes: a post timer circuit, which is coupled to the first comparison circuit, and is configured to operably count the post detection period, to generate a post timing signal; and a synchronous pulse determination circuit, which is coupled the post timer circuit, and is configured to operably determine whether the synchronous pulse is detected according to the post timing signal and the second comparison signal circuit, to generate the status switching signal accordingly.

In one preferable embodiment, the determination circuit further includes a non-overlapping timer circuit, which is coupled to the first comparison circuit and the synchronous pulse determination circuit, and is configured to operably count a non-overlapping period starting from when the positive pulse drops from higher than the positive threshold to the positive threshold, and generate a non-overlapping signal when the non-overlapping period exceeds a non-overlapping threshold, whereby the synchronous pulse determination circuit determines that the synchronous pulse exists when the second comparison signal indicates that the negative pulse is lower than the negative threshold after the non-overlapping period.

From another perspective, the present invention provides a pulse signal detection circuit, configured to operably determine whether a synchronous pulse exists in a synchronous signal by detecting a positive pulse higher than a positive threshold and a negative pulse lower than a negative threshold in the synchronous signal during a detection period, the pulse signal detection circuit comprising: a first comparison circuit, configured to operably generate a first comparison signal according to the synchronous signal and the positive threshold; a second comparison circuit, configured to operably generate a second comparison signal according to the synchronous signal and the negative threshold; and a determination circuit, which is coupled to the first comparison circuit and the second comparison circuit, and is configured to operably determine that the synchronous pulse exists when the first comparison signal indicates that the positive pulse of the synchronous signal is higher than the positive threshold and the second comparison signal indicates that the negative pulse of the synchronous signal is lower than the negative threshold in a post detection period after the positive pulse of the synchronous signal is determined higher than the positive threshold, and generate the status switching signal accordingly; wherein the post detection period is related to the detection period.

In one preferable embodiment, the pulse signal detection circuit further includes a first timer circuit, which is coupled to the first comparison circuit, and is configured to operably count a first duration period during which the first comparison signal keeps indicating that the positive pulse of the synchronous signal is continuously higher than the positive threshold, and generate a first confirmation signal which is inputted to the determination circuit when the first duration period is longer than a first period threshold, whereby the determination circuit determines that the positive pulse is higher than the positive threshold according to the first confirmation signal; wherein the detection period starts from a start time point at which the first comparison signal indicates that the positive pulse of the synchronous signal is higher than the positive threshold, and ends at an end time point of an end of the post detection period.

In one preferable embodiment, the pulse signal detection circuit further includes a second timer circuit, which is coupled to the second comparison circuit, and is configured to operably count a second duration period during which the second comparison signal keeps indicating that the negative pulse of the synchronous signal is continuously lower than the negative threshold, and generate a second confirmation signal which is inputted to the determination circuit when the second duration period is longer than a second period threshold, whereby the determination circuit determines that the negative pulse is lower than the negative threshold according to the second confirmation signal.

In one preferable embodiment, the determination circuit includes: a post timer circuit, which is coupled to the first comparison circuit, and is configured to operably count the post detection period, to generate a post timing signal; and a synchronous pulse determination circuit, which is coupled the post timer circuit, and is configured to operably determine whether the synchronous pulse is detected according to the post timing signal and the second comparison signal circuit, to generate the status switching signal accordingly.

In one preferable embodiment, the determination circuit further includes a non-overlapping timer circuit, which is coupled to the first comparison circuit and the synchronous pulse determination circuit, and is configured to operably count a non-overlapping period starting from when the positive pulse drops from higher than the positive threshold to the positive threshold, and generate a non-overlapping signal when the non-overlapping period exceeds a non-overlapping threshold, whereby the synchronous pulse determination circuit determines that the synchronous pulse exists when the second comparison signal indicates that the negative pulse is lower than the negative threshold after the non-overlapping period.

In one preferable embodiment, the synchronous pulse indicates a switching status of a switching signal or a synchronous rectifier (SR) control signal, wherein the switching signal operates a power transistor to control a primary winding of a power transformer, for converting an input voltage to an output voltage, and the SR control signal operates a synchronous rectifier (SR) transistor to control a secondary winding of the power transformer, whereby a power control circuit generates the switching signal or the SR control signal according to the status switching signal such that the power transistor and the SR transistor are not turned ON at the same time, wherein a pulse transformer generates the synchronous signal according to the switching signal or the SR control signal and delivers the synchronous signal to the pulse signal detection circuit.

From another perspective, the present invention provides a pulse signal detection method, for determining whether a synchronous signal includes a positive pulse higher than a positive threshold and a negative pulse lower than a negative threshold in a detection period, so as to determine whether a synchronous pulse exists in the synchronous signal, the pulse signal detection method comprising: comparing the synchronous signal with the positive threshold to generate a first comparison signal; comparing the synchronous signal with the negative threshold to generate a second comparison signal; and determining that the synchronous pulse exists when the first comparison signal indicates that the positive pulse of the synchronous signal is higher than the positive threshold and the second comparison signal indicates that the negative pulse of the synchronous signal is lower than the negative threshold in a post detection period after the positive pulse of the synchronous signal is determined higher than the positive threshold, and generating a status switching signal accordingly; wherein the post detection period is related to the detection period.

In one preferable embodiment, the pulse signal detection method further includes: counting a first duration period during which the first comparison signal keeps indicating that the positive pulse of the synchronous signal is continuously higher than the positive threshold, and generating a first confirmation signal when the first duration period is longer than a first period threshold; and determining that the positive pulse is higher than the positive threshold according to the first confirmation signal; wherein the detection period starts from a start time point at which the first comparison signal indicates that the positive pulse of the synchronous signal is higher than the positive threshold, and ends at an end time point of an end of the post detection period.

In one preferable embodiment, the pulse signal detection method further includes: counting a second duration period during which the second comparison signal keeps indicating that the negative pulse of the synchronous signal is continuously lower than the negative threshold; generating a second confirmation signal when the second duration period is longer than a second period threshold; and determining that the negative pulse is lower than the negative threshold according to the second confirmation signal.

In one preferable embodiment, the step of determining that the synchronous pulse is detected includes: counting the post detection period to generate a post counting signal; and determining whether the synchronous pulse exists according to the post timing signal and the second comparison signal circuit, to generate the status switching signal accordingly.

In one preferable embodiment, the step of determining that the synchronous pulse is detected includes: counting a non-overlapping period starting from when the positive pulse drops from higher than the positive threshold to the positive threshold; generating a non-overlapping signal when the non-overlapping period exceeds a non-overlapping threshold; and determining that the synchronous pulse exists after the non-overlapping period when the second comparison signal indicates that the negative pulse is lower than the negative threshold.

In one preferable embodiment, the synchronous pulse indicates a switching status of a switching signal or a synchronous rectifier (SR) control signal, wherein the switching signal operates a power transistor to control a primary winding of a power transformer, for converting an input voltage to an output voltage, and the SR control signal operates a synchronous rectifier (SR) transistor to control a secondary winding of the power transformer, whereby a power control circuit generates the switching signal or the SR control signal according to the status switching signal such that the power transistor and the SR transistor are not turned ON at the same time.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the circuits and the signal waveforms, but not drawn according to actual scale.

Figure 3:
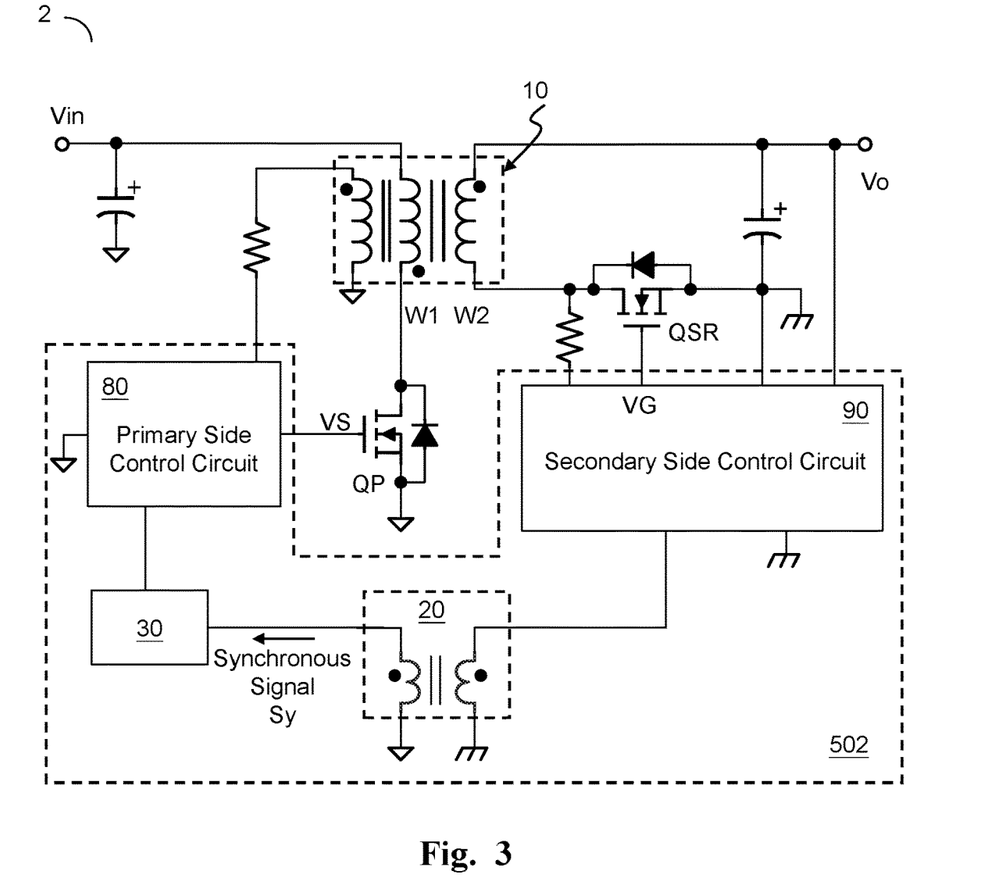
FIG. 3 shows a schematic diagram of an embodiment of a power control circuit according to the present invention.

FIG. 3 shows a schematic diagram of an embodiment of a power control circuit 502 according to the present invention. As shown in FIG. 3, also referring to FIG. 11 as well, a flyback power converter 2 includes a power transformer 10, a power control circuit 502, a power transistor QP, and a synchronous rectifier (SR) transistor QSR. The power control circuit 502 is configured to operably control the flyback power converter 2, so as to convert an input voltage Vin to an output voltage Vo. The power control circuit 502 includes a primary side control circuit 80, a secondary side control circuit 90, a pulse transformer 20, and a pulse signal detection circuit 30.

In the power control circuit 502, the primary side control circuit 80 is configured to operably generate a switching signal VS to control the power transistor QP, so as to control a primary winding W1 of the power transformer 10, to convert the input voltage Vin to the output voltage Vo. The secondary side control circuit 90 is configured to operably generate a synchronous rectifier (SR) control signal VG to control the SR transistor QSR, so as to control a secondary winding W2 of the power transformer 10. In this embodiment, the pulse transformer 20 generates a synchronous signal Sy according to the SR control signal VG by an isolated transmission method, for example but not limited to an electromagnetic induction method as shown in FIG. 3; the synchronous signal Sy is delivered to the pulse signal detection circuit 30 which is coupled to the primary side control circuit 80. Note that, the pulse transformer 20 is not limited to this embodiment as shown in the figure, which generates the synchronous signal Sy at the primary side of the power transformer 10. When the pulse signal detection circuit 30 is located at the secondary side of the power transformer 10, and is coupled to the secondary side control circuit 90, the pulse transformer 20 may generate the synchronous signal Sy in the isolated manner according to the switching signal VS, and deliver the synchronous signal Sy to the pulse signal detection circuit 30 which is coupled to the secondary side control circuit 90 (i.e., the synchronous signal Sy is generated at the secondary side of the power transformer 10).

Figure 11:
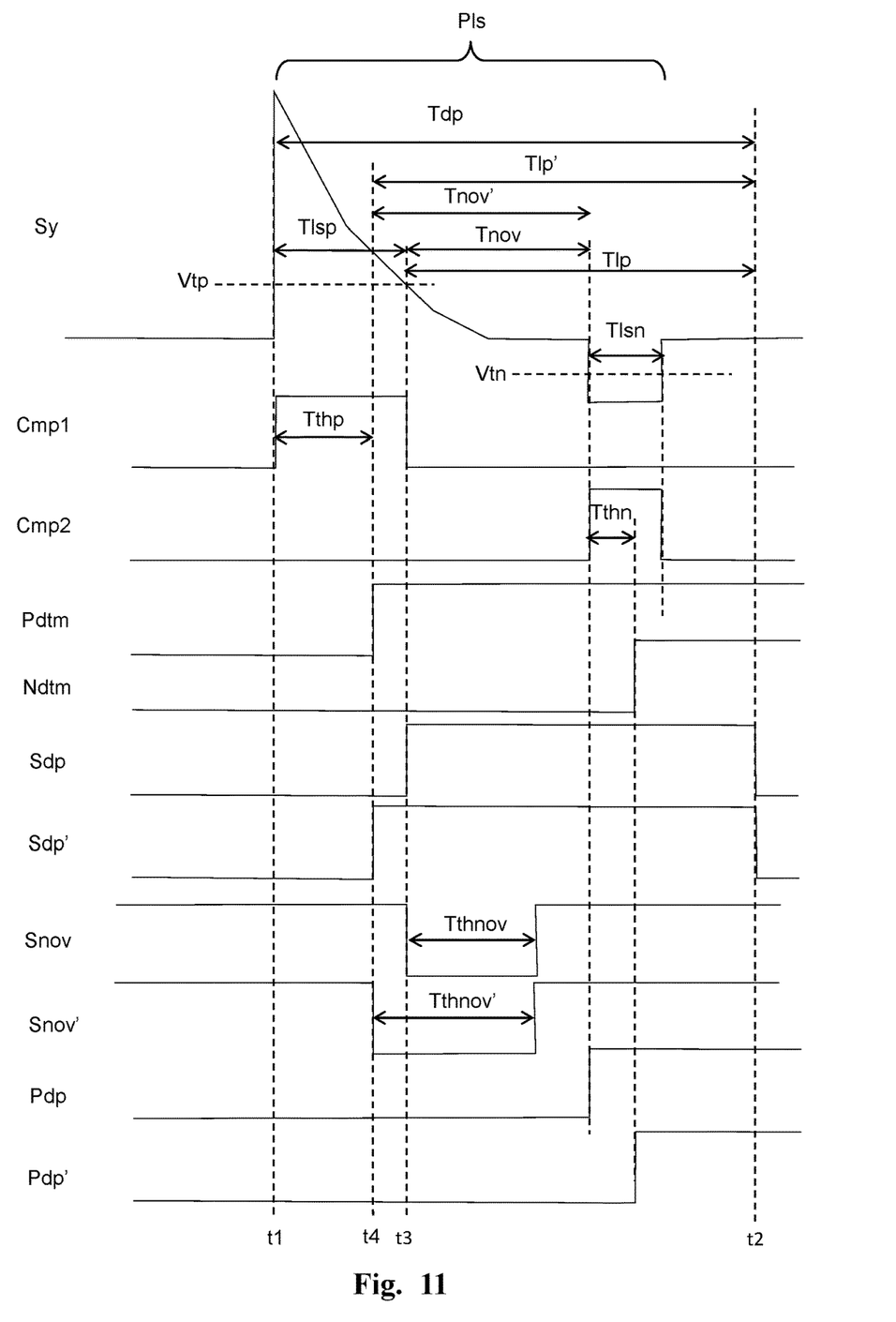
FIG. 11 show schematic waveforms corresponding to the embodiment of the power control circuit according to the present invention.

The pulse signal detection circuit 30 is coupled to the pulse transformer 20, and is configured to operably receive the synchronous signal Sy. In this embodiment, the pulse signal detection circuit 30 is located at the primary side of the power transformer 10, and is coupled to the primary side control circuit 80. The pulse signal detection circuit 30 detects a synchronous pulse Pls in the synchronous signal Sy to generate a status switching signal, wherein the synchronous pulse Pls indicates a switching status of the SR control signal VG in this embodiment. In another embodiment wherein the pulse signal detection circuit 30 is located at the secondary side of the power transformer 10, and is coupled to the secondary side control circuit 90, the synchronous pulse Pls can be used to indicate a switching status of the switching signal VS. Referring to FIG. 11, the pulse signal detection circuit 30 determines that a synchronous pulse Pls exists when a positive pulse higher than a positive threshold Vtp and a negative pulse lower than a negative threshold vtn are detected in the synchronous signal Sy during a detection period Tdp, and a status switching signal Pdp is generated accordingly. The detection period Tdp is a period predetermined according to the circuit parameters of the pulse transformer 20.

In the prior art, the pulse transformer requires a relatively higher inductance to deliver a synchronous pulse as shown in FIG. 2A which has a longer positive pulse, for the primary side control circuit 80 or the secondary side control circuit 90 which receives the synchronous pulse to be able to detect and identify the synchronous pulse. Or, the pulse transformer which has a relatively lower inductance because of a smaller size, can only deliver a synchronous pulse as shown in FIG. 2B which has a shorter positive pulse, whereby the primary side control circuit 80 or the secondary side control circuit 90 which receives the synchronous pulse requires a relatively complex design to detect and identify the synchronous pulse. Both prior art approaches increase the manufacturing cost of the power control circuit 501.

According to the present invention, the synchronous pulse Pls in the synchronous signal Sy is detected according to a characteristic of the synchronous signal Sy, as thus: when the pulse transformer 20 generates the synchronous pulse Pls in the synchronous signal Sy by an isolated transmission method (not in direct electrical contact), because of a current reflow which is caused by an inductor in the pulse transformer 20, a negative pulse is induced after a positive pulse of the synchronous pulse Pls. This negative pulse is the characteristic that can be used to detect the occurrence of the synchronous pulse Pls. The pulse signal detection circuit 30 for example counts a detection period Tdp when a positive pulse of the synchronous pulse Pls is detected, and in the detection period Tdp, the pulse signal detection circuit 30 determines that the synchronous pulse Pls exists when the positive pulse is higher than a positive threshold and there is a following negative pulse lower than a negative threshold, and a status switching signal Pdp is generated accordingly. As thus, compared to the prior art, the present invention can use a pulse transformer 20 with a relatively smaller size, which is only able to generate the synchronous pulse Pls as shown in FIG. 2B. And according to the present invention, the pulse signal detection circuit 30 which receives the synchronous signal Sy does not require a complex circuit for filtering the noise to identify the synchronous signal. Therefore, the manufacturing cost of the flyback power converter is reduced, and the size of the pulse transformer 20 is reduced as well, which can be integrated into an IC chip.

Figure 4:
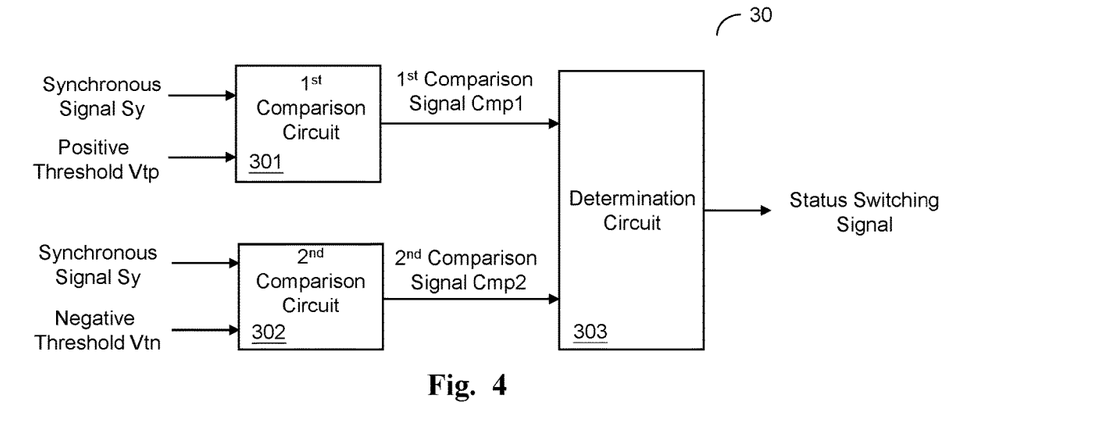
FIG. 4 shows a schematic diagram of an embodiment of the pulse signal detection circuit according to the present invention.

Referring to FIG. 4, which shows a schematic diagram of an embodiment of the pulse signal detection circuit (pulse signal detection circuit 30) according to the present invention. In this embodiment, also referring the schematic waveforms shown in FIG. 11 as well, the pulse signal detection circuit 30 includes a first comparison circuit 301, a second comparison circuit 302, and a determination circuit 303. The first comparison circuit 301 is coupled to the pulse transformer 20, and is configured to operably generate a first comparison signal Cmp1 according to the synchronous signal Sy and the positive threshold vtp. The second comparison circuit 302 is coupled to the pulse transformer 20, and is configured to operably generate a second comparison signal Cmp2 according to the synchronous signal Sy and the negative threshold Vtn.

The first comparison circuit 301 and the second comparison circuit 302 can be embodied in various ways. For example, the first comparison circuit 301 (or the second comparison circuit 302) may include a comparator which compares the synchronous signal Sy with the positive (or negative) threshold Vtp (or Vtn), to generate the first (or second) comparison signal Cmp1 (or Cmp2). Or, the first comparison circuit 301 or the second comparison circuit 302 for example may include a tri-electrode AC switch (TRIAC) which has a trigger voltage determined by the positive (or negative) threshold Vtp (or Vtn); in this case the first comparison circuit 301 or the second comparison circuit 302 needs only one input terminal for receiving the synchronous signal Sy. Note that, the first (or second) comparison circuit 301 (or 302) can be embodied by any circuit which can determine whether the synchronous signal Sy is higher (or lower) than the positive (or negative) threshold Vtp (or Vtn) and generate the first (or second) comparison signal Cmp1 (or Cmp2) accordingly.

The determination circuit 303 is coupled to the first comparison circuit 301 and the second comparison circuit 302, and is configured to operably determine whether the synchronous pulse Pls exists. When the first comparison signal Cmp1 indicates that the positive pulse of the synchronous signal Sy is higher than the positive threshold Vtp, in a post detection period after the positive pulse of the synchronous signal Sy is determined higher than the positive threshold Vtp, if the second comparison signal Cmp2 indicates that the negative pulse of the synchronous signal Sy is lower than the negative threshold, the determination circuit 303 generates the status switching signal Pdp to indicate a switching status of the switching signal VS or the SR control signal VG. Referring to FIG. 11, the post detection period for example is a period:

1. from a start time point t1 when the first comparison signal Cmp1 starts indicating that the positive pulse of the synchronous signal Sy is higher than the positive threshold Vtp, to an end time point t2 when the detection period Tdp ends, i.e., equal to the period Tdp (referred to hereinafter as the post detection period Tdp);
2. from a time point t3 when the first comparison signal Cmp1 starts indicating that the positive pulse of the synchronous signal Sy is lower than the positive threshold Vtp, to the end time point t2 when the detection period Tdp ends, i.e., the period Tlp; or
3. from a time point t4 when the first comparison signal Cmp1 keeps indicating that the positive pulse of the synchronous signal Sy is continuously higher than the positive threshold Vtp for at least a first duration period Tthp, to the end time point t2 when the detection period Tdp ends, i.e., the period Tlp' (referred to hereinafter as the post detection period Tlp').

That is, the above are three embodiments of the post detection period.

Figure 5:
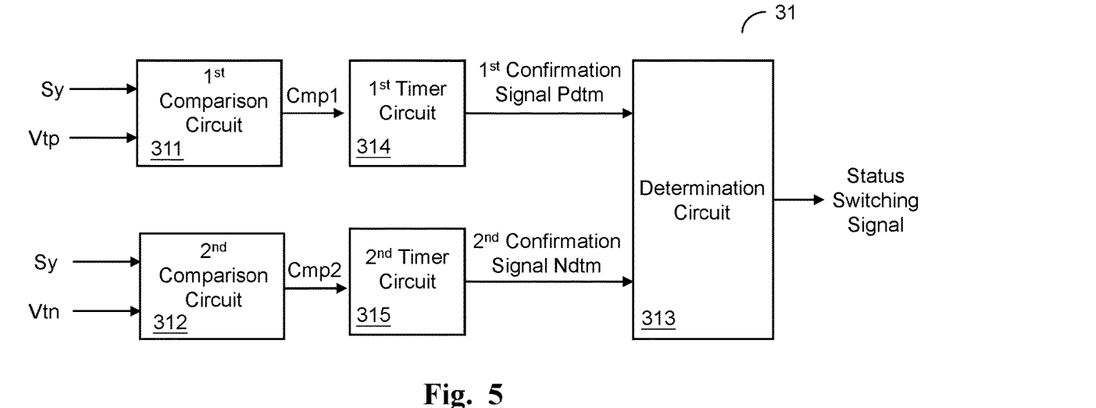
FIG. 5 shows a schematic diagram of another embodiment of the pulse signal detection circuit according to the present invention.

Referring to FIG. 5, which shows a schematic diagram of another embodiment of the pulse signal detection circuit (pulse signal detection circuit 31) according to the present invention. In this embodiment, also referring the schematic waveforms shown in FIG. 11 as well, the pulse signal detection circuit 31 includes a first comparison circuit 311, a second comparison circuit 312, a determination circuit 313, a first timer circuit 314, and a second timer circuit 315.

Compared to the embodiment shown in FIG. 4, in this embodiment, the pulse signal detection circuit 31 further includes the first timer circuit 314 and the second timer circuit 315. The first timer circuit 314 is coupled to the first comparison circuit 311, and counts a first duration period Tlsp during which the first comparison signal Cmp1 keeps indicating that the positive pulse of the synchronous signal Sy is continuously higher than the positive threshold Vtp; when the first duration period Tlsp is longer than the first period threshold Tthp, the first timer circuit 314 generates a first confirmation signal Pdtm which is sent to the determination circuit 313, and the determination circuit 313 determines that the positive pulse is higher than the positive threshold Vtp according to the first confirmation signal Pdtm. Note that the detection period Tdp starts from the start time point t1 when the first comparison signal Cmp1 starts indicating that the positive pulse of the synchronous signal Sy is higher than the positive threshold Vtp, and ends at the end time point t2 of the end of the post detection period Tlp.

The second timer circuit 315 is coupled to the second comparison circuit 312, and counts a second duration period Tlsn during which the second comparison signal Cmp2 keeps indicating that the negative pulse of the synchronous signal Sy is continuously lower than the negative threshold Vtn; when the second duration period Tlsn is longer than a second period threshold Tthn, the second timer circuit 315 generates a second confirmation signal Ndtm which is sent to the determination circuit 313, and the determination circuit 313 determines that the negative pulse is lower than the negative threshold Vtn according to the second confirmation signal Ndtm. The first timer circuit 314 and the second timer circuit 315 can be embodied by any circuits which have a timer or counter function.

Figure 6:
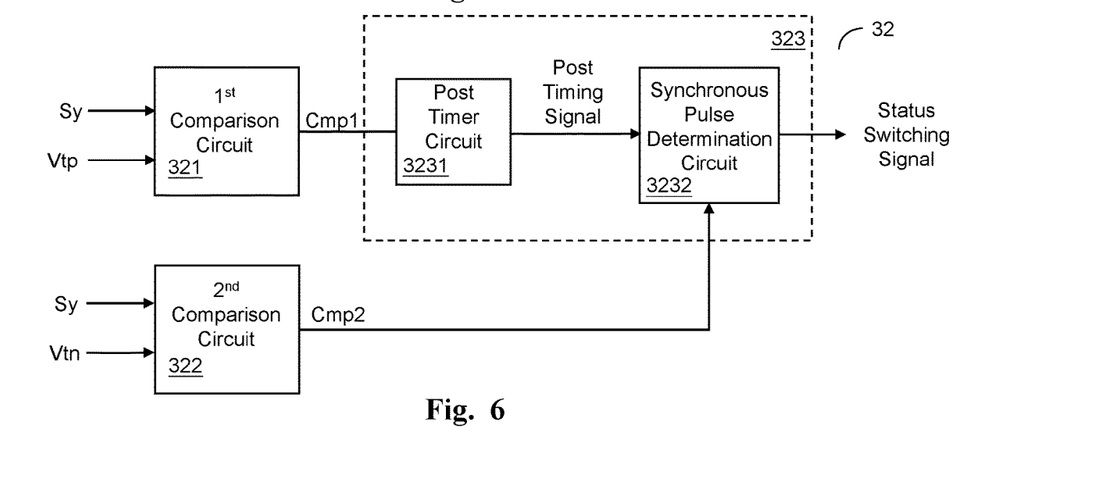
FIG. 6 shows a schematic diagram of another embodiment of the pulse signal detection circuit according to the present invention.

Referring to FIG. 6, which shows a schematic diagram of another embodiment of the pulse signal detection circuit (pulse signal detection circuit 32) according to the present invention. In this embodiment, also referring the schematic waveforms shown in FIG. 11 as well, the pulse signal detection circuit 32 includes a first comparison circuit 321, a second comparison circuit 322, and a determination circuit 323. In this embodiment, the determination circuit 323 includes a post timer circuit 3231 and a synchronous pulse determination circuit 3232. The post timer circuit 3231 is coupled to the first comparison circuit 321, to count the post detection period Tlp, so as to generate a post timing signal Sdp. The post timer circuit 3231 can be embodied by any circuit which has a timer or counter function. The synchronous pulse determination circuit 3232 is coupled to the post timer circuit 3231, to determine whether the synchronous pulse Pls exists according to the post timing signal Sdp and the second comparison signal Cmp2, and generate the status switching signal Pdp accordingly. The synchronous pulse determination circuit 3232 for example includes a logic circuit which is configured to determine whether the synchronous pulse Pls exists according to the post timing signal Sdp and the second comparison signal Cmp2.

Figure 7:
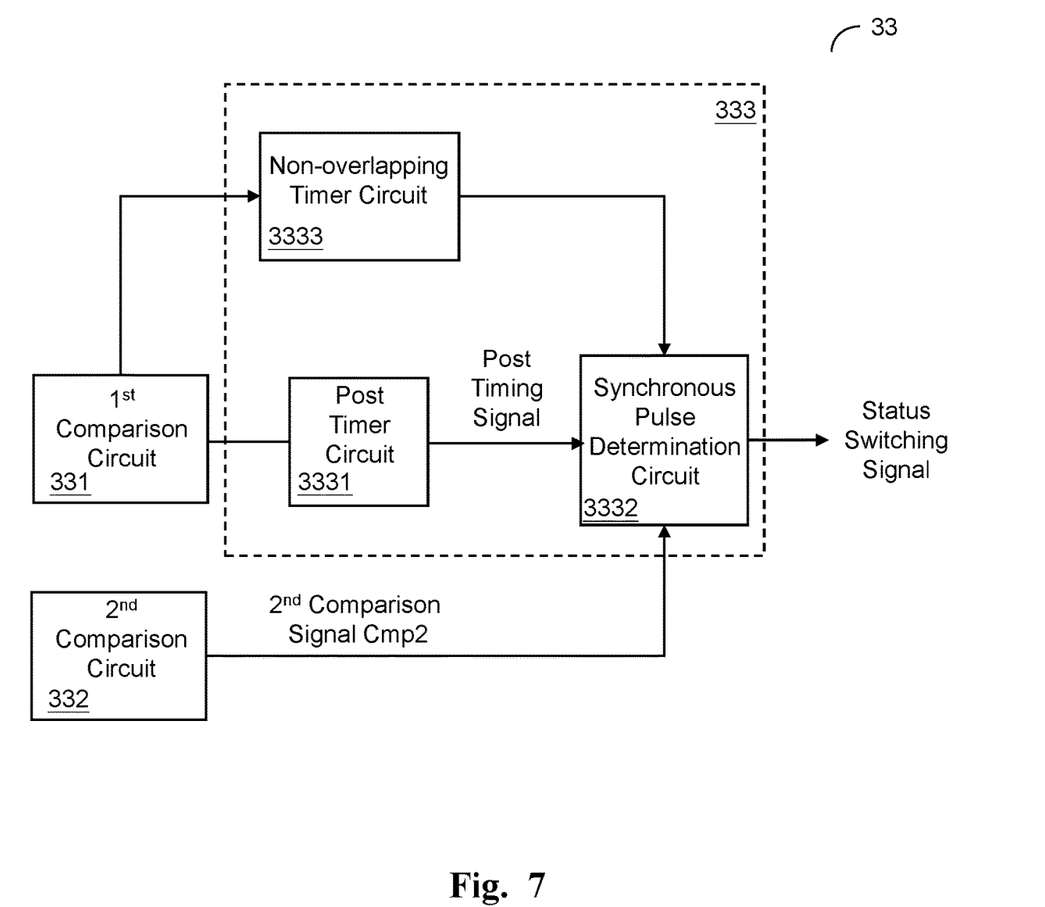
FIG. 7 shows a schematic diagram of another embodiment of the pulse signal detection circuit according to the present invention.

Referring to FIG. 7, which shows a schematic diagram of another embodiment of the pulse signal detection circuit (pulse signal detection circuit 33) according to the present invention. In this embodiment, also referring the schematic waveforms shown in FIG. 11 as well, the pulse signal detection circuit 33 includes a first comparison circuit 331, a second comparison circuit 332, and a determination circuit 333. In this embodiment, the determination circuit 333 includes a post timer circuit 3331, a synchronous pulse determination circuit 3332, and a non-overlapping timer circuit 3333.

Still referring to FIG. 7, the post timer circuit 3331 is coupled to the first timer circuit 331, to count the post detection period Tlp, so as to generate a post timing signal Sdp. The post timer circuit 3331 can be embodied by any circuit which has a timer or counter function.

This embodiment is different from which shown in FIG. 6 in that, in this embodiment, the determination circuit 333 further includes a non-overlapping timer circuit 3333, which determines whether a period between the positive pulse and the negative pulse of the synchronous signal is longer than a predetermined period (in this embodiment, the non-overlapping threshold Tthnov). The non-overlapping timer circuit 3333 is coupled to the first comparison circuit 331 and the synchronous pulse determination circuit 3332. The non-overlapping timer circuit 3333 counts a non-overlapping period Tnov from when the positive pulse drops from higher than the positive threshold Vtp to or below than the positive threshold Vtp, i.e., counts the non-overlapping period Tnov after the end of the positive pulse, and generates a non-overlapping signal Snov when the non-overlapping period Tnov exceeds a non-overlapping threshold Tthnov. The synchronous pulse determination circuit 3332 is coupled to the post timer circuit 3331, the second comparison circuit 332, and the non-overlapping timer circuit 3333. The synchronous pulse determination circuit 3332 determines that the synchronous pulse Pls exists according to the post timing signal Sdp, the second comparison signal Cmp2, and the non-overlapping signal Snov (i.e., after the non-overlapping period Tnov), and generates the status switching signal Pdp accordingly. The synchronous pulse determination circuit 3332 for example includes a logic circuit which is configured to determine that the synchronous pulse Pls exists according to the post timing signal Sdp, the second comparison signal Cmp2, and the non-overlapping signal Snov.

Figure 8:
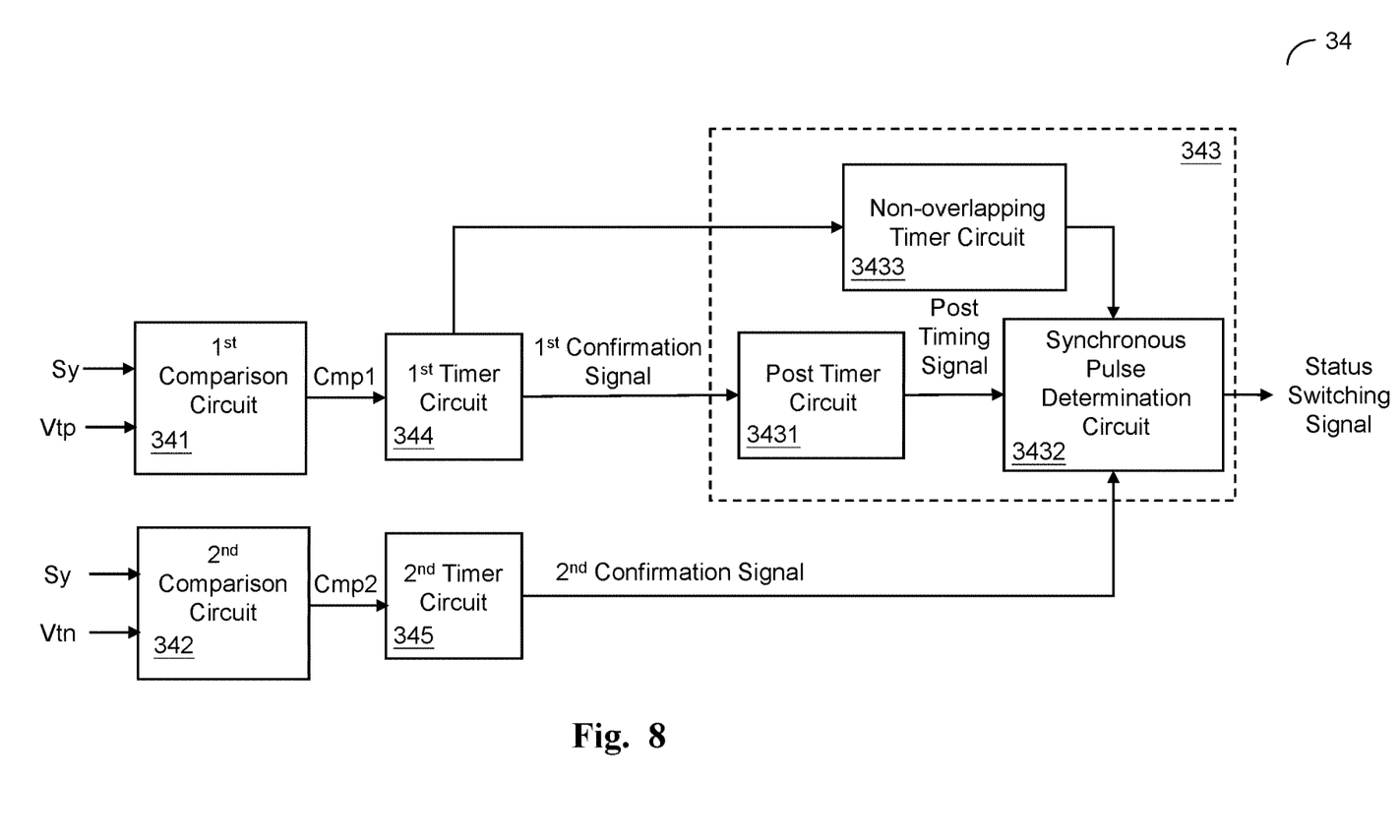
FIG. 8 shows a schematic diagram of another embodiment of the pulse signal detection circuit according to the present invention.

Referring to FIG. 8, which shows a schematic diagram of another embodiment of the pulse signal detection circuit (pulse signal detection circuit 34) according to the present invention. In this embodiment, also referring the schematic waveforms shown in FIG. 11 as well, the pulse signal detection circuit 34 includes a first comparison circuit 341, a second comparison circuit 342, a determination circuit 343, a first timer circuit 344, and a second timer circuit 345. The determination circuit 343 includes a post timer circuit 3431, a synchronous pulse determination circuit 3432, and a non-overlapping timer circuit 3433.

This embodiment is different from which shown in FIG. 7 in that, in this embodiment, the pulse signal detection circuit 34 further includes the first timer circuit 344 and the second timer circuit 345. Operations of the first timer circuit 344 and the second timer circuit 345 are the same as the first timer circuit 314 and the second timer circuit 315 shown in FIG. 5. The first timer circuit 344 and the second timer circuit 345 are used for counting a period during which the first comparison signal Cmp1 keeps indicating that the positive pulse of the synchronous signal Sy is continuously higher than the positive threshold Vtp, and a period during which the second comparison signal Cmp2 keeps indicating that the negative pulse of the synchronous signal Sy is continuously lower than the negative threshold Vtn, respectively, and generate the first confirmation signal Pdtm and the second confirmation signal Ndtm, respectively.

In this embodiment, the post timer circuit 3431 is coupled to the first timer circuit 344, to count the post detection period Tlp', so as to generate a post timing signal Sdp'. The non-overlapping timer circuit 3433 is coupled to the first timer circuit 344. The non-overlapping timer circuit 3433 counts a non-overlapping period Tnov' starting from when the first duration period Tlsp exceeds the first duration period Tthp, and generates a non-overlapping signal Snov' when the non-overlapping period Tnov' exceeds a non-overlapping threshold Tthnov'. Note that, in the first duration period Tlsp, the first comparison signal Cmp1 keeps indicating that the positive pulse of the synchronous signal Sy is continuously higher than the positive threshold Vtp.

In this embodiment, the synchronous pulse determination circuit 3432 is coupled to the post timer circuit 3431, the second timer circuit 345, and the non-overlapping timer circuit 3433. The synchronous pulse determination circuit 3432 determines that the synchronous pulse Pls exists according to the post timing signal Sdp', the second confirmation signal Ndtm, and the non-overlapping signal Snov' (i.e., after the non-overlapping period Tnov'), and generates the status switching signal Pdp' when the second confirmation signal Ndtm indicates that the negative pulse is continuously lower than the negative threshold Vtn for over a second period threshold Tthm after the non-overlapping period Tnov'.

Figure 9:
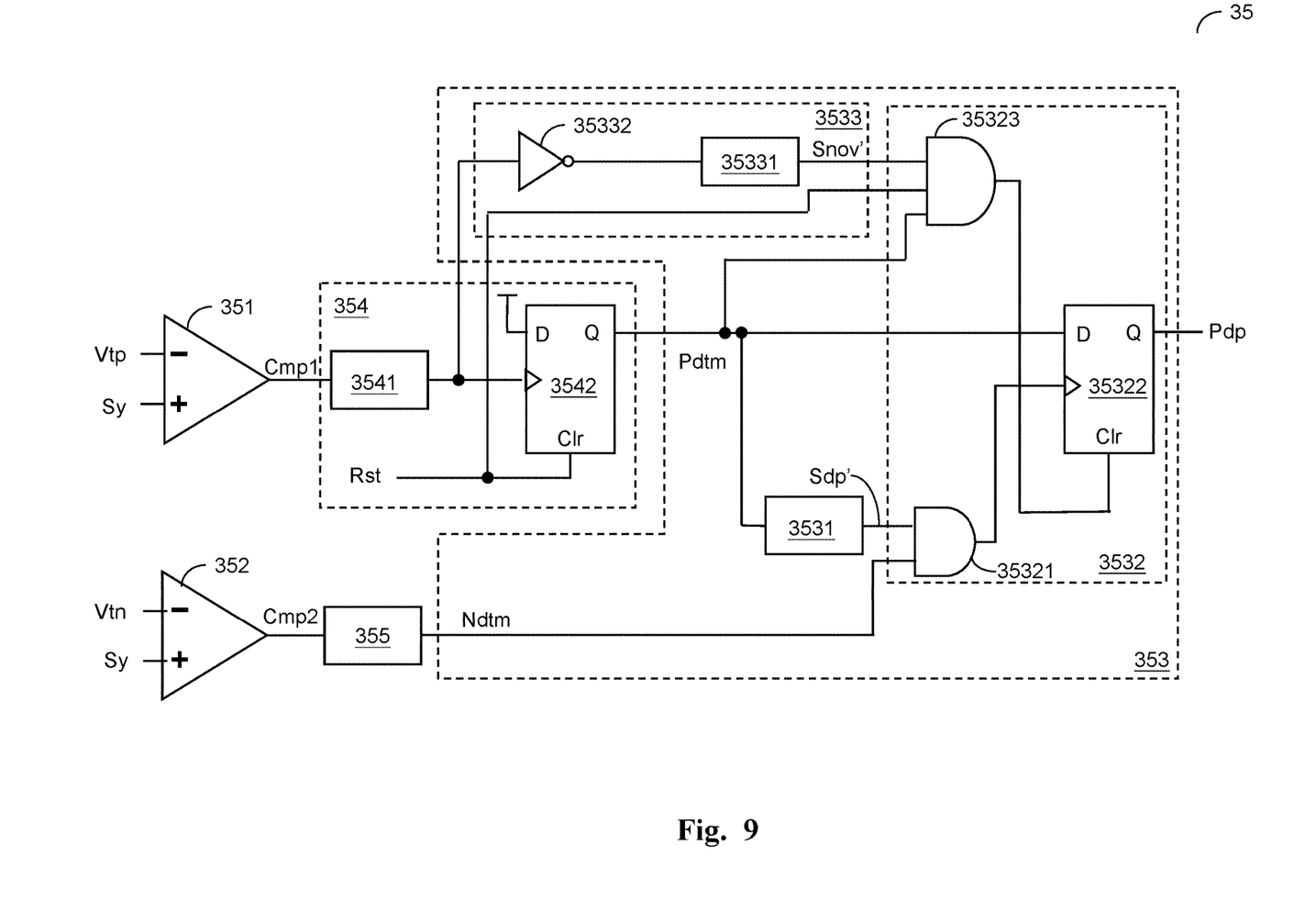
FIG. 9 shows a schematic diagram of another embodiment of the pulse signal detection circuit according to the present invention.

Referring to FIG. 9, which shows a schematic diagram of another embodiment of the pulse signal detection circuit (pulse signal detection circuit 35) according to the present invention. In this embodiment, also referring the schematic waveforms shown in FIG. 11 as well, the pulse signal detection circuit 35 includes a first comparison circuit 351, a second comparison circuit 352, a determination circuit 353, a first timer circuit 354, and a second timer circuit 355. The determination circuit 353 includes a post timer circuit 3531, a synchronous pulse determination circuit 3532, and a non-overlapping timer circuit 3533.

In this embodiment, the first timer circuit 354 for example includes a timer circuit 3541 and a latch circuit 3542 (for example but not limited to a D-type flip-flop as shown in the figure). The D-type flip-flop includes an input terminal D, an output terminal Q, a clear terminal Clr, and a clock terminal, as well known by those skilled in the art, so details thereof are not redundantly explained here. The first timer circuit 354 is coupled to the first comparison circuit 351, and counts the first duration period Tlsp during which the first comparison signal Cmp1 keeps indicating that the positive pulse of the synchronous signal Sy is continuously higher than the positive threshold Vtp, and generates the first confirmation signal Pdtm when the first duration period Tlsp is longer than the first period threshold Tthp. The post timer circuit 3531 counts the post detection period Tlp' to generate a post timing signal Sdp'. Note that the latch circuit 3542 is not limited to the D-type flip-flop, but may be another type of latch circuit.

The synchronous pulse determination circuit 3532 for example includes a logic circuit 35321 (such as an AND gate shown in the figure), a latch circuit 35322 (such as a D-type flip-flop shown in the figure), and a logic circuit 35323 (such as an AND gate shown in the figure). The logic circuit 35321 is coupled to the post timer circuit 3531 and the second timer circuit 355, and generates an output signal which is inputted to a clock terminal of the latch circuit 35322 (the D-type flip-flop) according to the post timing signal Sdp' and the second confirmation signal Ndtm. The logic circuit 35323 is coupled to the non-overlapping timer circuit 3533 and the first timer circuit 354, and generates an output signal which is inputted to a clear terminal Clr of the latch circuit 35322 according to the non-overlapping signal Snov' and the first confirmation signal Pdtm. The latch circuit 35322 determines whether the synchronous pulse Pls exists according to output signals of the logic circuit 35321, the latch circuit 35312 (the first confirmation signal Pdtm), and the logic circuit 35323, to generate the status switching signal Pdp. Note that, the logic circuits 35321 and 35323 are not limited to the AND gates as shown in the figure, but may be other types of logic gates.

The non-overlapping timer circuit 3533 for example includes a timer circuit 35331 and a logic circuit 35332 (for example but not limited to a NOT gate as shown in the figure). The non-overlapping timer circuit 3533 is coupled to the first timer circuit 354, and counts a non-overlapping period Tnov' starting from when the first duration period Tlsp exceeds the first duration period Tthp, and generates a non-overlapping signal Snov' when the non-overlapping period Tnov' exceeds the non-overlapping threshold Tthnov'. Note that, in the first duration period Tlsp, the first comparison signal Cmp1 keeps indicating that the positive pulse of the synchronous signal Sy is continuously higher than the positive threshold Vtp.

Figure 10:
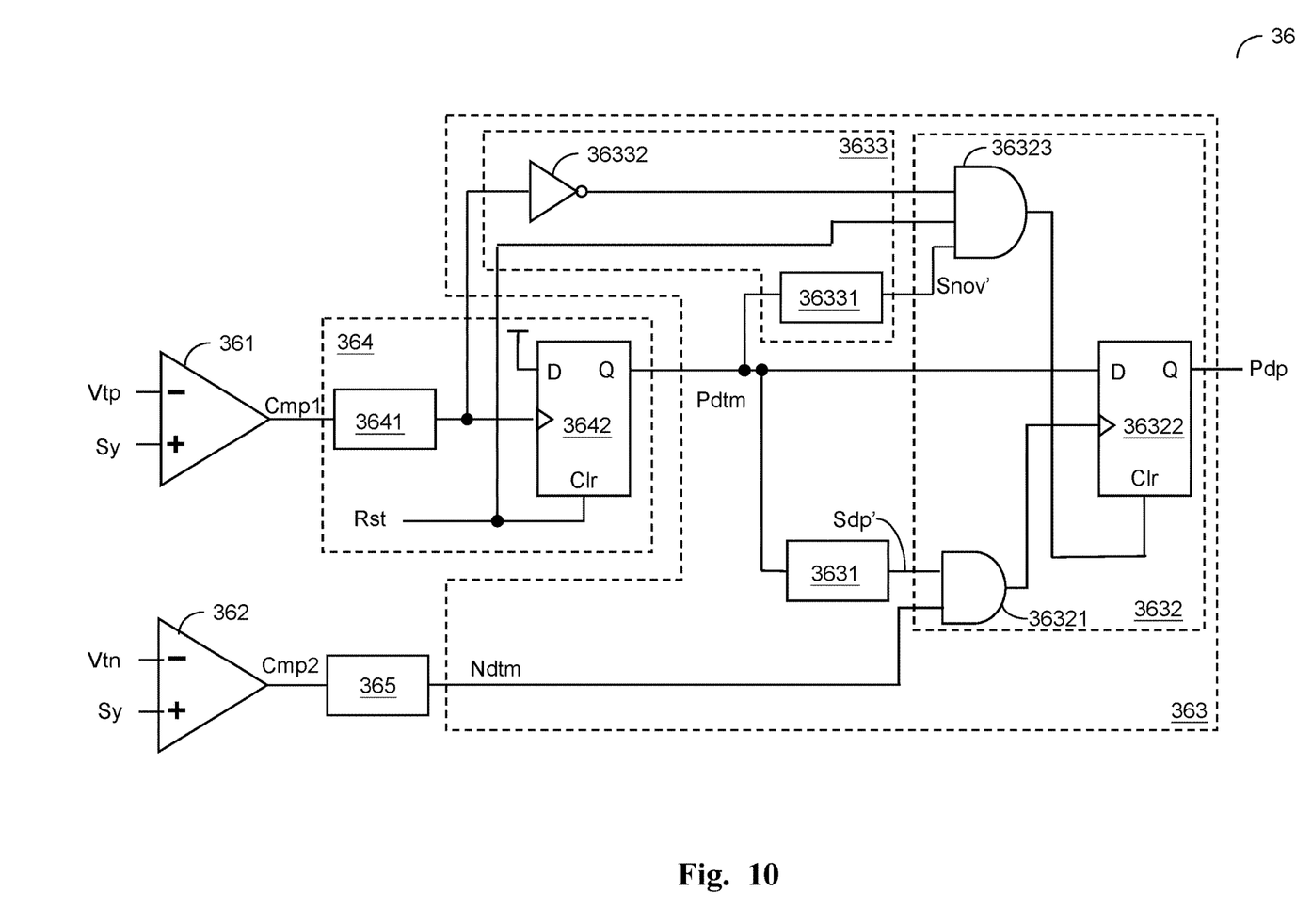
FIG. 10 shows a schematic diagram of another embodiment of the pulse signal detection circuit according to the present invention.

Referring to FIG. 10, which shows a schematic diagram of another embodiment of the pulse signal detection circuit (pulse signal detection circuit 36) according to the present invention. In this embodiment, also referring the schematic waveforms shown in FIG. 11 as well, the pulse signal detection circuit 36 includes a first comparison circuit 361, a second comparison circuit 362, a determination circuit 363, a first timer circuit 364, and a second timer circuit 365. The determination circuit 363 includes a post timer circuit 3631, a synchronous pulse determination circuit 3632, and a non-overlapping timer circuit 3633.

In this embodiment, the first timer circuit 364 for example includes a timer 3641 and a latch circuit 3642 (for example but not limited to a D-type flip-flop as shown in the figure). The D-type flip-flop includes an input terminal D, an output terminal Q, a clear terminal Clr, and a clock terminal, as well known by those skilled in the art, so details thereof are omitted here. The first timer circuit 364 is coupled to the first comparison circuit 361; the first timer circuit 364 counts the first duration period Tlsp during which the first comparison signal Cmp1 keeps indicating that the positive pulse of the synchronous signal Sy is continuously higher than the positive threshold Vtp, and generates the first confirmation signal Pdtm when the first duration period Tlsp is longer than the first period threshold Tthp. The post timer circuit 3631 counts the post detection period Tlp' to generate a post timing signal Sdp'. Note that the latch circuit 3642 is not limited to the D-type flip-flop, but may be another type of latch circuit.

The synchronous pulse determination circuit 3632 for example includes a logic circuit 36321 (such as an AND gate shown in the figure), a latch circuit 36322 (such as a D-type flip-flop shown in the figure), and a logic circuit 36323 (such as an AND gate shown in the figure). The logic circuit 36321 is coupled to the post timer circuit 3631 and the second timer circuit 365, and generates an output signal which is inputted to a clock terminal of the latch circuit 36322 (the D-type flip-flop) according to the post timing signal Sdp' and the second confirmation signal Ndtm. The logic circuit 36323 is coupled to the non-overlapping timer circuit 3633 and the first timer circuit 364, and generates an output signal which is inputted to a clear terminal Clr of the latch circuit 36322 according to the non-overlapping signal Snov' and the first confirmation signal Pdtm. The latch circuit 36322 determines whether the synchronous pulse Pls exists according to output signals of the logic circuit 36321, the latch circuit 36312 (the first confirmation signal Pdtm), and the logic circuit 36323, and generates the status switching signal Pdp accordingly.

The non-overlapping timer circuit 3633 for example includes a timer circuit 36331 and a logic circuit 36332 (for example but not limited to a NOT gate as shown in the figure). The non-overlapping timer circuit 3633 is coupled to the first timer circuit 364, and counts the non-overlapping period Tnov' starting form when the first duration period Tlsp exceeds the first duration period Tthp, and generates the non-overlapping signal Snov' when the non-overlapping period Tnov' exceeds the non-overlapping threshold Tthnov'. Note that, in the first duration period Tlsp, the first comparison signal Cmp1 keeps indicating that the positive pulse of the synchronous signal Sy is continuously higher than the positive threshold Vtp.

The present invention has been described in considerable detail with reference to certain preferred embodiments thereof. It should be understood that the description is for illustrative purpose, not for limiting the scope of the present invention. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. Furthermore, those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. The spirit of the present invention should cover all such and other modifications and variations, which should be interpreted to fall within the scope of the following claims and their equivalents.

What is claimed is:

1. A power control circuit, configured to operably control a flyback power converter, the power control circuit comprising:
   a primary side control circuit, configured to operably generate a switching signal to control a power transistor of the flyback power converter, so as to control a primary winding of a power transformer of the flyback power converter to convert an input voltage to an output voltage;
   a secondary side control circuit, configured to operably generate a synchronous rectifier (SR) control signal to control a synchronous rectifier (SR) transistor of the flyback power converter, so as to control a secondary winding of the power transformer;
   a pulse transformer, which is coupled between the primary side control circuit and the secondary side control circuit, and is configured to operably generate a synchronous signal according to the switching signal or the SR control signal; and
   a pulse signal detection circuit, which is coupled to the pulse transformer, and is configured to operably receive the synchronous signal and detect a synchronous pulse in the synchronous signal to generate a status switching signal, wherein the synchronous pulse indicates a switching status of the switching signal or the SR control signal;
   wherein the pulse signal detection circuit determines that the synchronous pulse exists by detecting a positive pulse higher than a positive threshold and a negative pulse lower than a negative threshold in the synchronous signal during a detection period, and generates the status switching signal accordingly.

2. The power control circuit of claim 1, wherein the pulse signal detection circuit includes:
   a first comparison circuit, which is coupled to the pulse transformer, and is configured to operably generate a first comparison signal according to the synchronous signal and the positive threshold;
   a second comparison circuit, which is coupled to the pulse transformer, and is configured to operably generate a second comparison signal according to the synchronous signal and the negative threshold; and
   a determination circuit, which is coupled to the first comparison circuit and the second comparison circuit, and is configured to operably determine that the synchronous pulse exists when the first comparison signal indicates that the positive pulse of the synchronous signal is higher than the positive threshold and the second comparison signal indicates that the negative pulse of the synchronous signal is lower than the negative threshold in a post detection period after the positive pulse of the synchronous signal is determined higher than the positive threshold, and generate the status switching signal accordingly;
wherein the post detection period is related to the detection period.

3. The power control circuit of claim 2, wherein the pulse signal detection circuit further includes a first timer circuit, which is coupled to the first comparison circuit, and is configured to operably count a first duration period during which the first comparison signal keeps indicating that the positive pulse of the synchronous signal is continuously higher than the positive threshold, and generate a first confirmation signal which is inputted to the determination circuit when the first duration period is longer than a first period threshold, whereby the determination circuit determines that the positive pulse is higher than the positive threshold according to the first confirmation signal;
wherein the detection period starts from a start time point at which the first comparison signal indicates that the positive pulse of the synchronous signal is higher than the positive threshold, and ends at an end time point of an end of the post detection period.

4. The power control circuit of claim 2, wherein the pulse signal detection circuit further includes a second timer circuit, which is coupled to the second comparison circuit, and is configured to operably count a second duration period during which the second comparison signal keeps indicating that the negative pulse of the synchronous signal is continuously lower than the negative threshold, and generate a second confirmation signal which is inputted to the determination circuit when the second duration period is longer than a second period threshold, whereby the determination circuit determines that the negative pulse is lower than the negative threshold according to the second confirmation signal.

5. The power control circuit of claim 2, wherein the determination circuit includes:
a post timer circuit, which is coupled to the first comparison circuit, and is configured to operably count the post detection period, to generate a post timing signal; and
a synchronous pulse determination circuit, which is coupled the post timer circuit, and is configured to operably determine whether the synchronous pulse exists according to the post timing signal and the second comparison signal, to generate the status switching signal accordingly.

6. The power control circuit of claim 5, wherein the determination circuit further includes a non-overlapping timer circuit, which is coupled to the first comparison circuit and the synchronous pulse determination circuit, and is configured to operably count a non-overlapping period starting from when the positive pulse drops from higher than the positive threshold to the positive threshold, and generate a non-overlapping signal when the non-overlapping period exceeds a non-overlapping threshold, whereby the synchronous pulse determination circuit determines that the synchronous pulse exists when the second comparison signal indicates that the negative pulse is lower than the negative threshold after the non-overlapping period.

7. The power control circuit of claim 3, wherein the pulse signal detection circuit further includes a second timer circuit, which is coupled to the second comparison circuit, and is configured to operably count a second duration period during which the second comparison signal keeps indicating that the negative pulse of the synchronous signal is continuously lower than the negative threshold, and generate a second confirmation signal which is inputted to the determination circuit when the second duration period is longer than a second period threshold, wherein the determination circuit includes:
a post timer circuit, which is coupled to the first timer circuit, and is configured to operably count the post detection period, to generate a post timing signal;
a non-overlapping timer circuit, which is coupled to the first timer circuit, and is configured to operably count a non-overlapping period starting from when the positive pulse drops from higher than the positive threshold to the positive threshold, and generate a non-overlapping signal when the non-overlapping period exceeds a non-overlapping threshold; and
a synchronous pulse determination circuit, which is coupled to the post timer circuit, the second timer circuit, and the non-overlapping timer circuit, and is configured to operably determine that the synchronous pulse exists when the second confirmation signal indicates that the negative pulse is continuously lower than the negative threshold for over the second period threshold after the non-overlapping period, to generate the status switching signal accordingly.

8. A pulse signal detection circuit, configured to operably determine whether a synchronous pulse exists in a synchronous signal by detecting a positive pulse higher than a positive threshold and a negative pulse lower than a negative threshold in the synchronous signal during a detection period, the pulse signal detection circuit comprising:
a first comparison circuit, configured to operably generate a first comparison signal according to the synchronous signal and the positive threshold;
a second comparison circuit, configured to operably generate a second comparison signal according to the synchronous signal and the negative threshold; and
a determination circuit, which is coupled to the first comparison circuit and the second comparison circuit, and is configured to operably determine that the synchronous pulse exists when the first comparison signal indicates that the positive pulse of the synchronous signal is higher than the positive threshold and the second comparison signal indicates that the negative pulse of the synchronous signal is lower than the negative threshold in a post detection period after the positive pulse of the synchronous signal is determined higher than the positive threshold, and generate a status switching signal accordingly;
wherein the post detection period is related to the detection period.

9. The pulse signal detection circuit of claim 8, wherein the pulse signal detection circuit further includes a first timer circuit, which is coupled to the first comparison circuit, and is configured to operably count a first duration period during which the first comparison signal keeps indicating that the positive pulse of the synchronous signal is continuously higher than the positive threshold, and generate a first confirmation signal which is inputted to the determination circuit when the first duration period is longer than a first period threshold, whereby the determination circuit determines that the positive pulse is higher than the positive threshold according to the first confirmation signal;
wherein the detection period starts from a start time point at which the first comparison signal indicates that the positive pulse of the synchronous signal is higher than the positive threshold, and ends at an end time point of an end of the post detection period.

10. The pulse signal detection circuit of claim 8, wherein the pulse signal detection circuit further includes a second timer circuit, which is coupled to the second comparison circuit, and is configured to operably count a second duration period during which the second comparison signal keeps indicating that the negative pulse of the synchronous signal is continuously lower than the negative threshold, and generate a second confirmation signal which is inputted to the determination circuit when the second duration period is longer than a second period threshold, whereby the determination circuit determines that the negative pulse is lower than the negative threshold according to the second confirmation signal.

11. The pulse signal detection circuit of claim 8, wherein the determination circuit includes:
   a post timer circuit, which is coupled to the first comparison circuit, and is configured to operably count the post detection period, to generate a post timing signal; and
   a synchronous pulse determination circuit, which is coupled the post timer circuit, and is configured to operably determine whether the synchronous pulse exists according to the post timing signal and the second comparison signal, to generate the status switching signal accordingly.

12. The pulse signal detection circuit of claim 11, wherein the determination circuit further includes a non-overlapping timer circuit, which is coupled to the first comparison circuit and the synchronous pulse determination circuit, and is configured to operably count a non-overlapping period starting from when the positive pulse drops from higher than the positive threshold to the positive threshold, and generate a non-overlapping signal when the non-overlapping period exceeds a non-overlapping threshold, whereby the synchronous pulse determination circuit determines that the synchronous pulse exists when the second comparison signal indicates that the negative pulse is lower than the negative threshold after the non-overlapping period.

13. The pulse signal detection circuit of claim 9, wherein the pulse signal detection circuit further includes a second timer circuit, which is coupled to the second comparison circuit, and is configured to operably count a second duration period during which the second comparison signal keeps indicating that the negative pulse of the synchronous signal is continuously lower than the negative threshold, and generate a second confirmation signal which is inputted to the determination circuit when the second duration period is longer than a second period threshold, wherein the determination circuit includes:
   a post timer circuit, which is coupled to the first timer circuit, and is configured to operably count the post detection period, to generate a post timing signal;
   a non-overlapping timer circuit, which is coupled to the first timer circuit, and is configured to operably count a non-overlapping period starting from when the positive pulse drops from higher than the positive threshold to the positive threshold, and generate a non-overlapping signal when the non-overlapping period exceeds a non-overlapping threshold; and
   a synchronous pulse determination circuit, which is coupled to the post timer circuit, the second timer circuit, and the non-overlapping timer circuit, and is configured to operably determine that the synchronous pulse exists when the second confirmation signal indicates that the negative pulse is continuously lower than the negative threshold for over the second period threshold after the non-overlapping period, to generate the status switching signal accordingly.

14. The pulse signal detection circuit of claim 8, wherein the synchronous pulse indicates a switching status of a switching signal or a synchronous rectifier (SR) control signal, wherein the switching signal operates a power transistor to control a primary winding of a power transformer, for converting an input voltage to an output voltage, and the SR control signal operates a synchronous rectifier (SR) transistor to control a secondary winding of the power transformer, whereby a power control circuit generates the switching signal or the SR control signal according to the status switching signal such that the power transistor and the SR transistor are not turned ON at the same time, wherein a pulse transformer generates the synchronous signal according to the switching signal or the SR control signal and delivers the synchronous signal to the pulse signal detection circuit.

15. A pulse signal detection method, for determining whether a synchronous signal includes a positive pulse higher than a positive threshold and a negative pulse lower than a negative threshold in a detection period, so as to determine whether a synchronous pulse exists in the synchronous signal, the pulse signal detection method comprising:
   comparing the synchronous signal with the positive threshold to generate a first comparison signal;
   comparing the synchronous signal with the negative threshold to generate a second comparison signal; and
   determining that the synchronous pulse exists when the first comparison signal indicates that the positive pulse of the synchronous signal is higher than the positive threshold and the second comparison signal indicates that the negative pulse of the synchronous signal is lower than the negative threshold in a post detection period after the positive pulse of the synchronous signal is determined higher than the positive threshold, and generating a status switching signal accordingly;
   wherein the post detection period is related to the detection period.

16. The pulse signal detection method of claim 15, further comprising:
   counting a first duration period during which the first comparison signal keeps indicating that the positive pulse of the synchronous signal is continuously higher than the positive threshold, and generating a first confirmation signal when the first duration period is longer than a first period threshold; and
   determining that the positive pulse is higher than the positive threshold according to the first confirmation signal;
   wherein the detection period starts from a start time point at which the first comparison signal indicates that the positive pulse of the synchronous signal is higher than the positive threshold, and ends at an end time point of an end of the post detection period.

17. The pulse signal detection method of claim 15, further comprising:
   counting a second duration period during which the second comparison signal keeps indicating that the negative pulse of the synchronous signal is continuously lower than the negative threshold;
   generating a second confirmation signal when the second duration period is longer than a second period threshold; and
   determining that the negative pulse is lower than the negative threshold according to the second confirmation signal.

18. The pulse signal detection method of claim 15, wherein the step of determining that the synchronous pulse exists includes:
  counting the post detection period to generate a post timing signal; and
  determining whether the synchronous pulse exists according to the post timing signal and the second comparison signal circuit, to generate the status switching signal accordingly.

19. The pulse signal detection method of claim 18, wherein the step of determining that the synchronous pulse exists includes:
  counting a non-overlapping period starting from when the positive pulse drops from higher than the positive threshold to the positive threshold;
  generating a non-overlapping signal when the non-overlapping period exceeds a non-overlapping threshold; and
  determining that the synchronous pulse exists after the non-overlapping period when the second comparison signal indicates that the negative pulse is lower than the negative threshold.

20. The pulse signal detection method of claim 15, further comprising:
  counting a second duration period during which the second comparison signal keeps indicating that the negative pulse of the synchronous signal is continuously lower than the negative threshold;
  generating a second confirmation signal when the second duration period is longer than a second period threshold;
  counting the post detection period to generate a post timing signal;
  counting a non-overlapping period starting from when the positive pulse drops from higher than the positive threshold to the positive threshold;
  generating a non-overlapping signal when the non-overlapping period exceeds a non-overlapping threshold; and
  determining that the synchronous pulse exists after the non-overlapping period when the second confirmation signal indicates that the negative pulse is continuously lower than the negative threshold for over the second period threshold, and generating the status switching signal accordingly.

21. The pulse signal detection method of claim 15, wherein the synchronous pulse indicates a switching status of a switching signal or a synchronous rectifier (SR) control signal, wherein the switching signal operates a power transistor to control a primary winding of a power transformer, for converting an input voltage to an output voltage, and the SR control signal operates a synchronous rectifier (SR) transistor to control a secondary winding of the power transformer, whereby a power control circuit generates the switching signal or the SR control signal according to the status switching signal such that the power transistor and the SR transistor are not turned ON at the same time.

* * * * *